(12) United States Patent
Hirano et al.

(10) Patent No.: US 7,710,142 B2
(45) Date of Patent: May 4, 2010

(54) SEMICONDUCTOR INTEGRATED CIRCUIT

(75) Inventors: Ryo Hirano, Tokyo (JP); Yukihide Suzuki, Hino (JP); Hidekazu Egawa, Akishima (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/323,075

(22) Filed: Nov. 25, 2008

(65) Prior Publication Data

US 2009/0134892 A1 May 28, 2009

(30) Foreign Application Priority Data

Nov. 28, 2007 (JP) .............................. 2007-306789

(51) Int. Cl.
*G01R 31/02* (2006.01)
*G01R 31/28* (2006.01)

(52) U.S. Cl. .................... 324/765; 324/158.1; 324/73.1; 307/130

(58) Field of Classification Search ......... 324/754–765; 307/130
See application file for complete search history.

(56) References Cited

U.S. PATENT DOCUMENTS 5,404,099 A * 4/1995 Sahara ..................... 324/158.1
7,183,671 B2 * 2/2007 Kawanishi et al. .......... 307/130
7,336,089 B2 * 2/2008 Yang .......................... 324/763

FOREIGN PATENT DOCUMENTS

JP 10-284554 A 10/1998

* cited by examiner

*Primary Examiner*—Ha Tran T Nguyen
*Assistant Examiner*—Emily Y Chan
(74) *Attorney, Agent, or Firm*—Sughrue Mion, PLLC

(57) ABSTRACT

A semiconductor integrated circuit includes power supply pads of two or more kinds, switches each of which is connected between adjacent two of the power supply pads to allow short-circuiting them, and at least one control line connected to control terminals of the switches according to the kinds of the power supply pads connected to the switches.

12 Claims, 3 Drawing Sheets

SEMICONDUCTOR INTEGRATED CIRCUIT

This application is based upon and claims the benefit of priority from Japanese Patent Application No. 2007-306789, filed on Nov. 28, 2007, the disclosure of which is incorporated herein in its entirety by reference.

BACKGROUND OF THE INVENTION

1. Field of the Invention

This invention relates to a semiconductor integrated circuit.

2. Description of Related Art

In a manufacturing process of a related semiconductor integrated circuit, electric inspection called a probe test is executed for the semiconductor integrated circuit in a (wafer) state that the semiconductor integrated circuit is formed on a semiconductor substrate together with a lot of other semiconductor integrated circuits. The probe test is executed by making probes come in contact with pads formed on a wafer. To increase inspection efficiency by increasing the number of integrated circuits which are inspected at a time, it is necessary to reduce the number of probes which come in contact with the pads of each integrated circuit. In other words, it is necessary to reduce the number of pads which come in contact with the probes in each integrated circuit.

So far, a method of short-circuiting two pads by means of a fuse is known as a method of reducing the number of pads which come in contact with the probes. According to this method, by supplying a predetermined electric potential to one of the two pads, the same electric potential is also supplied to the other of the pads. By blowing the fuse after finish of inspection, the two pads become independent from each other. Such a technique is disclosed in Japanese Laid-Open Patent Publication No. Hei10-284554.

SUMMARY

To increase inspection efficiency of a prove test, there is a request to reduce further the number of pads which come in contact with probes. It is possible to connect plural power supply pads to each other. However, when the power supply pads with different usage are simply connected to each other with an aluminum wire or the like, there is possibility that a problem of the noise propagation is caused after a semiconductor circuit is turned into a finished product.

Furthermore, in a case where fuses are used to connect the power supply pads to each other, it is necessary that a lot of pairs of the power supply pads are connected by a lot of fuses in order to prevent electric current concentration. Consequently, in such a case, there is a problem that it is necessary to blow the large number of the fuses afterwards.

In addition, when the number of the power supply pads which come into contact with the probes are reduced, electric current which flows through each of the probes is increased. In such a case, if the increased current, which is relatively large, is continue to be supplied to the probe, especially on a high temperature condition, there is a possibility of a following problem. That is, the power supply pad (made of aluminum), which comes in contact with the probe, melts and adheres to the tip of the probe and thereby increasing contact resistance between the probe and the power supply pad. Therefore, the invention seeks to provide a semiconductor integrated circuit which can easily short-circuit power supply pads and electrically isolate the power supply pads which are short-circuited.

Furthermore, the invention seeks to provide a semiconductor integrated circuit which can prevent a power supply pad from melting at a probe test.

In one embodiment, there is a provided a semiconductor integrated circuit that includes a plurality of power supply pads including two or more kinds with different usage, one or more switches having control terminals respectively, each of the switches connected to two of the power supply pads which are adjacent to each other so as to select a short-circuited state or an electrically isolated state between the two power supply pads, and one or more control lines connected to the control terminals according to the kinds of the power supply pads to which the switches are connected.

According to the semiconductor integrated circuit, by supplying a control signal to a control line, it is possible to control a plurality of switches all together.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
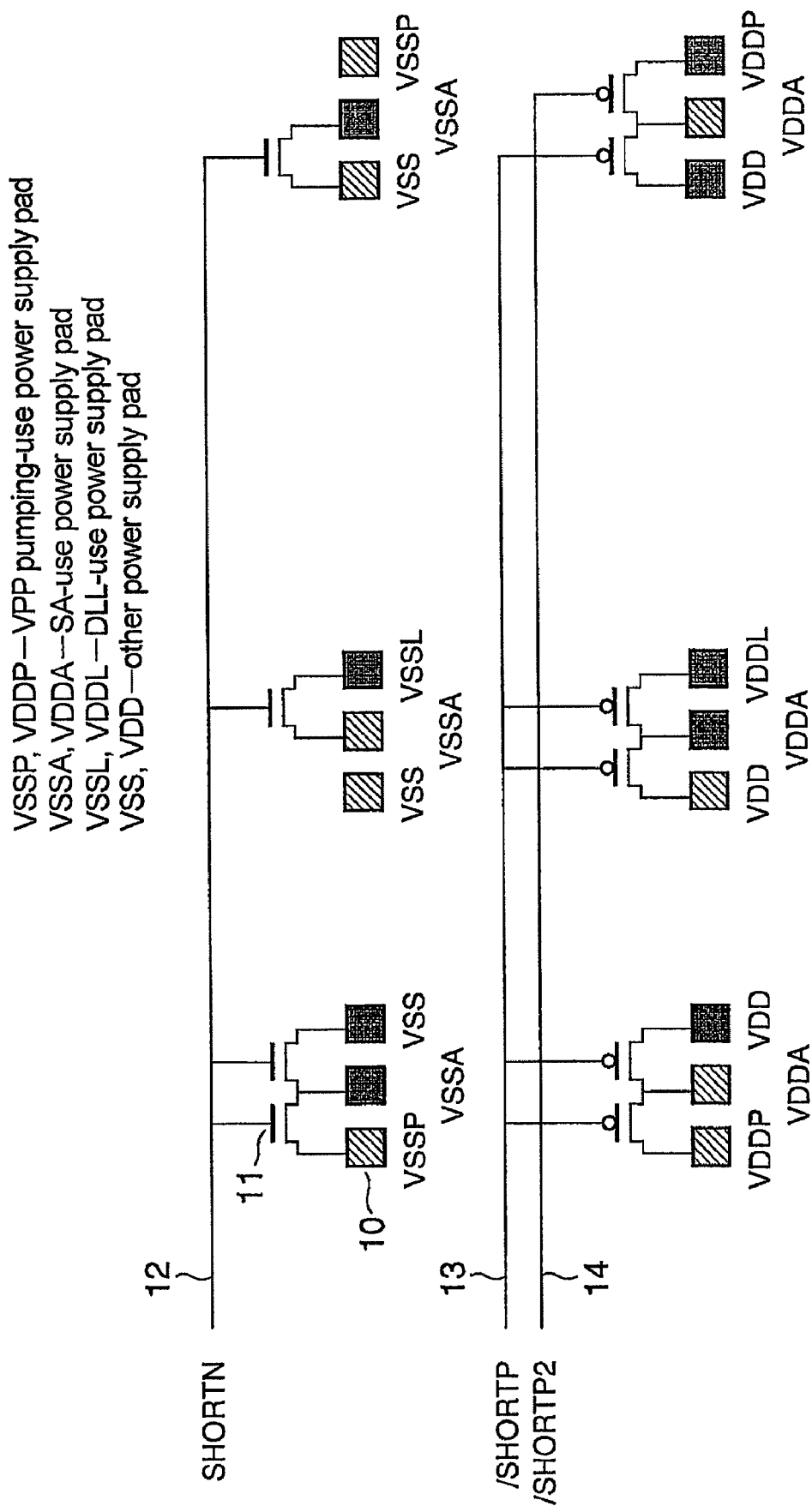
FIG. 1 is a diagram showing a configuration example of periphery of power supply pads included in a semiconductor integrated circuit according to a first embodiment of the invention.

Referring now to FIG. 1, a semiconductor integrated circuit (or a chip) according to a first embodiment of the present invention includes a plurality of power supply pads 10. FIG. 1 shows an example of an arrangement of the power supply pads 10 depicted as small squares. The semiconductor integrated circuit further includes non-illustrated semiconductor devices. The semiconductor integrated circuit is, for example, a dynamic random access memory (DRAM).

In FIG. 1, the power supply pads 10 are classified into four kinds according to their intended use. That is, there are VPP pump-use power supply pads (VSSP and VDDP), SA-use power supply pads (VSSA and VDDA), DLL-use power supply pads (VSSL and VDDL) and other power supply pads (VSS and VDD). The power supply pads classified into each kind include lower potential side and higher potential side power supply pads. The lower potential side power supply pads (referred to as a VSS pad group) are illustrated in the upper side of FIG. 1 while the higher potential side power supply pads (referred to as a VDD pad group) are illustrated in the lower side of FIG. 1.

Hatched (or shaded) squares signify power supply pads which are used to come in contact with probes at a probe test. These power supply pads may be called contact pads hereinafter. The other squares signify power supply pads which do not come in contact with the probes at the probe test. These power supply pads may be called non-contact pads hereinafter. The semiconductor integrated circuit according to the embodiment includes a plurality of MOS transistors 11 as switches (or switching means) to connect the non-contact pads with neighboring power supply pads.

All of the MOS transistors connected to the power supply pads of the VSS group are N channel MOS (NMOS) transistors and their gates (i.e. control terminals) are connected to a first control line 12 in common.

All of the MOS transistors connected to the power supply pads of the VDD group are P channel MOS (PMOS) transistors. The PMOS transistors are classified into one or more groups (e.g. two groups) according to the kinds of the power supply pads to which the PMOS transistors connected. Gates (i.e. control terminals) of the PMOS transistors are connected to a control line in each group. In this embodiment, the gates of the PMOS transistors are connected to second control line 13 or third control line 14. Specifically, the gates of the MOS transistors connected between the power supply pads VDDP and VDDA are connected to the third control line 14 in common. On the other hand, the gates of the MOS transistors connected between the power supply pads of other combinations of the VDD pad group are connected to the second control line 13 in common.

In the above mentioned configuration, by turning on the MOS transistor, the power supply pads connected to the MOS transistor is short-circuited and electric potentials of those pads become equal to each other. By connecting the non-contact pad with the contact pad via the MOS transistor (and other power supply pad(s) and the MOS transistor(s) connected with the other power supply pad(s)), it is possible to make the electric potential of the non-contact pad become equal to that of the contact pad.

For instance, the VSSP pad located at the leftmost in the VSS pad group comes in contact with a probe at the probe test while the VSSA pad neighboring the VSSP pad does not come in contact with any probe. However, the MOS transistor is connected between these VSSP and VSSA pads. Thus, it is possible to short-circuit the VSSP pad and the VSSA pad by turning on the MOS transistor connected between them. As for other power supply pads, it is similar.

On the other hand, by turning off the MOS transistor, the power supply pads connected to the MOS transistor is electrically isolated. Thus, it is possible to isolate the power supply pads short-circuited once. In other words, the MOS transistor allows selecting a short-circuited state or an electrically isolated state of the power supply pads connected to the MOS transistor.

The first, the second and the third control lines 12, 13 and 14 of FIG. 1 are supplied with first, second and third control signals SHORTN, /SHORTP and /SHORTP2, respectively. The control signals SHORTN, /SHORTP and /SHORTP2 are used for controlling the MOS switches and produced by a control circuit as illustrated in FIG. 2, for example.

Figure 2:
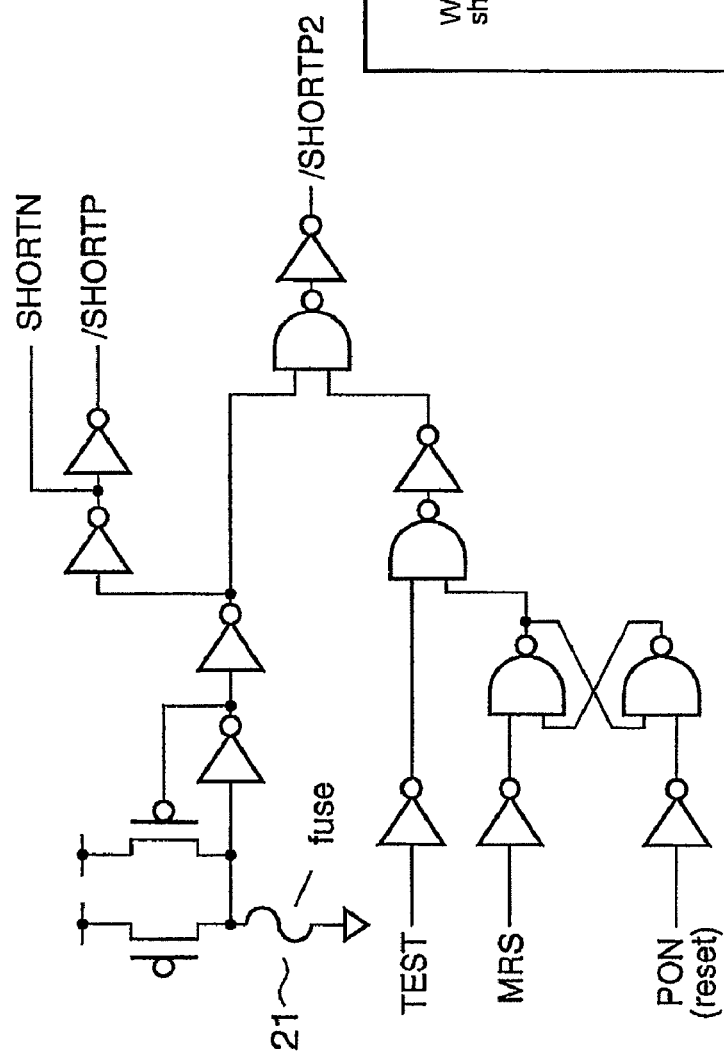
FIG. 2 is a circuit diagram of a control circuit which controls MOS transistors connected to the power supply pads of FIG. 1.

The control circuit of FIG. 2 includes a fuse 21 and is configured by combining the fuse 21 with logic circuits so that the first control signal SHORTN is in a logic high level when the fuse is not blown and that the first control signal SHORTN is in a logic low level when the fuse is blown. Furthermore, the control circuit is configured to logically invert the first control signal SHORTN to produce the second control signal /SHORTP.

Furthermore, the control circuit of FIG. 2 is configured to produce the third control signal /SHORTP2 according to a combination of command inputs PON (reset), MRS and TEST and a blown or unblown state of the fuse 21.

When the fuse 21 is not blown in the control circuit of FIG. 2, all of the first, the second and the third control signals SHORTN, /SHORTP and /SHORTP2 are put into an activated state. Consequently, all of the MOS transistors connected to the first, the second and the third control lines are turned on. Thus, the power supply pads of the VSS pad group become equal to one another in electric potential. Similarly, the power supply pads of the VDD pad group become equal to one another in electric potential. As a result, it is possible to execute the probe test in a state that the number of probes which come in contact with the power supply pads is reduced.

When the fuse 21 is blown, the first and the second control signals SHORTN and /SHORTP are put into an inactivated state and thereby the MOS transistors connected to the first and the second control lines are turned off. Consequently, the power supply pads connected to each of these MOS transistors become electrically independent from each other. Thus, it is possible to prevent from propagating unintended noise via the power supply pads after the semiconductor integrated circuit having the control circuit is turned into a finished product (e.g. Thin Small-Outline Package or the like).

The third control signal /SHORTP2 is different from the first and the second control signals in intended purpose. When the fuse is not blown, the third control signal /SHORTP2 is used for short-circuiting the power supply pads like the other control signals SHORTN and /SHORTP. On the other hand, when the fuse is blown, the third control signal is used for short-circuiting the VDDP power supply pad and the VDDA power supply pad to prevent electric current concentrating to the VDDP power supply pad which deals with relatively large power consumption or peak current. This is provided for a probe test using a probe card having unreduced number of probes which comes in contact with power supply pads.

Figure 3:
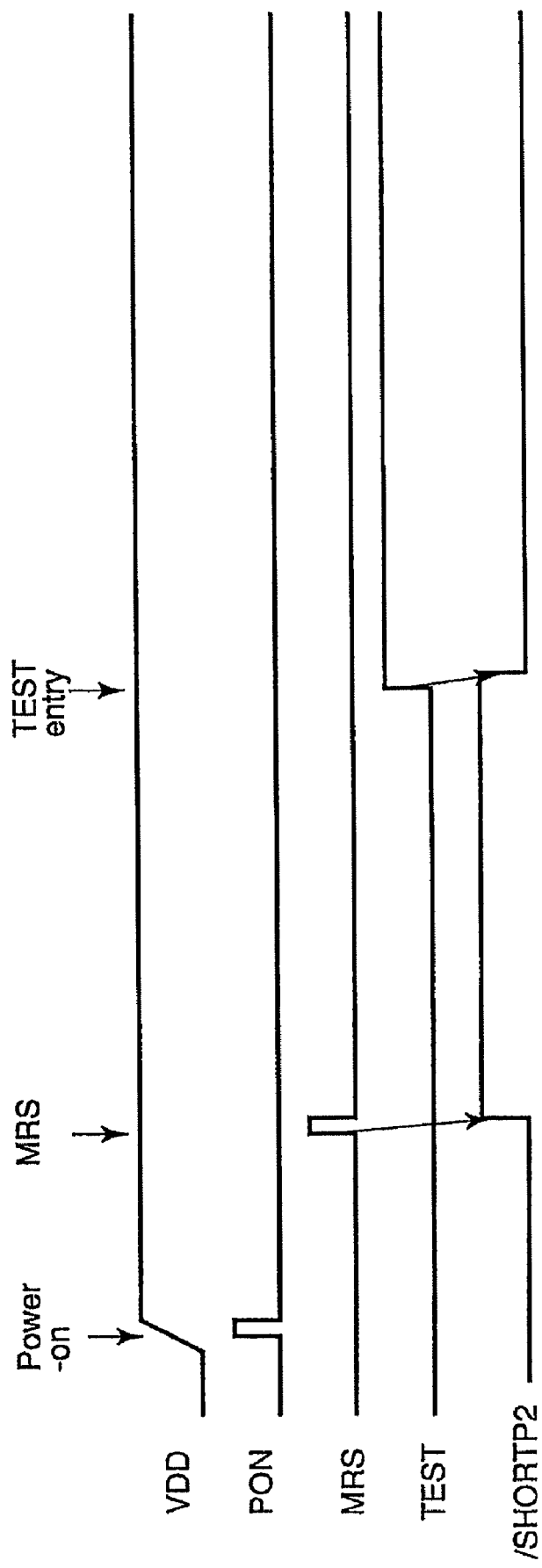
FIG. 3 is a timing chart showing input signals input to the control circuit of FIG. 2 and a control signal -/SHORTP2 output from the control circuit of FIG. 2.

FIG. 3 shows a timing chart of input commands and the third control signal when the fuse is blown.

As illustrated in FIG. 3, when the power supply is turned on, the third control signal /SHORTP2 is put into the activated state according to a power-on signal PON and thereby short-circuiting the VDDP power supply pad and the VDDA power supply pad. This is for distributing the current because the current consumption at each VDDP power supply pad is increased by supplying the VPP level to the VDDP pads all together when the power supply is turned on.

Next, on inputting an MRS command, the third control signal /SHORTP2 is put into the inactivated state and thereby the MOS transistors controlled by third control signal are turned off. The reason why these MOS transistors are turned off is to prevent noise caused by the VPP pumping from propagating as much as possible. The finished product is used in this state (that the VDDP and the VDDA pads are electrically isolated by each other).

Consequently, on inputting a TEST command, the third control signal /SHORTP2 is put into the activated state again and thereby short-circuiting the VDDP pad and the VDDA pad. This is provided to put the third control signal /SHORTP2 into the activated state by force in order that the VDDA pad is used for distributing the current from the VDDP pad after the fuse is blown (e.g. in a final probe test or the like).

As mentioned above, according to the embodiment, the semiconductor integrated circuit includes two or more kinds of the power supply pads with different usage and the switches which are connected between some pairs of the power supply pads. The power supply pads in each pair are adjacent to each other. The control terminals of the switches are connected to different control lines according to the kinds of the power supply pads to which the switches are connected. In other words, each of the control lines is connected to plural switches according to the kinds of the power supply pads to which the switches are connected. With this configuration, it is possible to selectively short-circuit or isolate pairs of the power supply pads all together by supplying the control signals to the control lines. Therefore, it is possible not only to reduce the number of the power supply pads which come in contact with the probes when the probe test is executed but also to selectively short-circuit or isolate the pairs of the power supply pads all together by supplying the control signals to the control lines.

Because the semiconductor integrated circuit includes the control circuit which is change the logical levels of the control signals according to not only the state of the fuse but also the input signals, it is possible to distribute the current flowing through the power supply pads in a case where a large consumption current or peak current is caused. Consequently, it is possible to prevent aluminum forming the power supply pads from melting and adhering to the probe. Furthermore, it is possible to increase the number of the use of the probes.

It is apparent that the present invention is not limited to the above embodiments, but may be modified and changed without departing from the scope and spirit of the invention. For example, through the embodiment includes four kinds of the power supply pads, the number of kinds may be not four but one or more. Though the number of kinds may be one, it is effective to connect different kinds of power supply pads by means of switches.

Though the first to the third control lines are provided in the above mentioned embodiment, one or more control line may be provided for any purpose. For example, only switches connected to pads of the VSS pad group or the VDD pad group may be connected to a control line in common.

Though the MRS command is used as a command to put the third control signal /SHRTP2 into the inactivated state in the above mentioned embodiment, another command used in initializing sequence of a DRAM, e.g. a PALL command or an AREF command, may be used.

What is claimed is:

1. A semiconductor integrated circuit comprising:
    a plurality of power supply pads including two or more kinds with different usage,
    one or more switches having control terminals respectively, each of the switches connected to two of the power supply pads which are adjacent to each other so as to select a short-circuited state or an electrically isolated state between the two power supply pads, and
    one or more control lines connected to the control terminals according to the kinds of the power supply pads to which the switches are connected,
    the power supply pads comprises two or more kinds of high electric potential side power supply pads and low electric potential side power supply pads corresponding to the high electric potential side power supply pads, and
    the switches connected to the high voltage sides power supply pads are classified into one or more groups according to the kinds of the high voltage sides power supply pads connected to the switches, the switches belonging to each of the groups being connected to another one of the control lines in common.

2. A semiconductor integrated circuit according to claim 1, wherein the power supply pads comprises low electric potential side power supply pads, and
    wherein all of the switches connected to the low voltage sides power supply pads are connected to one of the control lines to in common.

3. A semiconductor integrated circuit according to claim 1, wherein the power supply pads comprises high electric potential side power supply pads, and
    wherein the switches connected to the high voltage sides power supply pads are classified into one or more groups according to the kinds of the high voltage sides power supply pads connected to the switches, the switches belonging to each of the groups being connected to one of the control lines in common.

4. A semiconductor integrated circuit according to claim 1, wherein each of the switches are connected to two of the low electric potential side power supply pads or two of the high electric potential side power supply pads, and
    all of the switches connected to the low voltage sides power supply pads are connected to one of the control lines in common.

5. A semiconductor integrated circuit according to claim 1, further comprising:
    a control unit is connected to the control lines to control the switches by supplying a control signal to each of the control lines.

6. A semiconductor integrated circuit according to claim 5, wherein the control unit comprises a fuse and is configured so that a logical level of the control signal is changed by blowing the fuse.

7. A semiconductor integrated circuit according to claim 5, wherein the control unit comprises a fuse and is configured so that a logical level of the control signal is changed by a combination of an input signal provided from an outside and a blown or unblown state of the fuse.

8. A semiconductor integrated circuit according to claim 5, wherein the control unit comprises a fuse to produce first and second control signals and is configured so that a logical level of the first control signal is changed by blowing the fuse and so that a logical level of the second control signal is changed by a combination of an input signal provided from an outside and a blown or unblown state of the fuse.

9. A testing method of a semiconductor integrated circuit comprising:
    supplying a control signal to a switch connected to two power supply pads adjacent to each other to short-circuit the power supply pads, and
    supplying power supply voltage to one of the power supply pads through a probe and to the other of the power supply pads from the one of the power supply pads through the switch to test the semiconductor integrated circuit,
    wherein the semiconductor integrated circuit comprises a plurality of power supply pads including two or more kinds with different usage; one or more switches having control terminals respectively, each of the switches connected to two of the power supply pads which are adjacent to each other so as to select a short-circuited state or an electrically isolated state between the two power supply pads; and one or more control lines connected to the control terminals according to the kinds of the power supply pads to which the switches are connected,
    the power supply pads comprises two or more kinds of high electric potential side power supply pads and low electric potential side power supply pads corresponding to the high electric potential side power supply pads, and
    the switches connected to the high voltage sides power supply pads are classified into one or more groups according to the kinds of the high voltage sides power supply pads connected to the switches, the switches belonging to each of the groups being connected to another one of the control lines in common.

10. A semiconductor integrated circuit comprising:

a plurality of power supply pads including two or more kinds with different usage;

one or more switches having control terminals respectively, each of the switches connected to two of the power supply pads which are adjacent to each other so as to select a short-circuited state or an electrically isolated state between the two power supply pads;

the power supply pads comprises two or more kinds of high electric potential side power supply pads and low electric potential side power supply pads corresponding to the high electric potential side power supply pads, and the switches connected to the high voltage sides power supply pads are classified into one or more groups according to the kinds of the high voltage sides power supply pads connected to the switches, the switches belonging to each of the groups being connected to another one of the control lines in common, one or more control lines connected to the control terminals according to the kinds of the power supply pads to which the switches are connected; and a control unit is connected to the control lines to control the switches by supplying a control signal to each of the control lines, wherein the control unit comprises a fuse and is configured so that a logical level of the control signal is changed by blowing the fuse.

11. A semiconductor integrated circuit comprising:

a plurality of power supply pads including two or more kinds with different usage;

one or more switches having control terminals respectively, each of the switches connected to two of the power supply pads which are adjacent to each other so as to select a short-circuited state or an electrically isolated state between the two power supply pads;

the power supply pads comprises two or more kinds of high electric potential side power supply pads and low electric potential side power supply pads corresponding to the high electric potential side power supply pads, and the switches connected to the high voltage sides power supply pads are classified into one or more groups according to the kinds of the high voltage sides power supply pads connected to the switches, the switches belonging to each of the groups being connected to another one of the control lines in common, one or more control lines connected to the control terminals according to the kinds of the power supply pads to which the switches are connected; and a control unit is connected to the control lines to control the switches by supplying a control signal to each of the control lines, wherein the control unit comprises a fuse and is configured so that a logical level of the control signal is changed by a combination of an input signal provided from an outside and a blown or unblown state of the fuse.

12. A semiconductor integrated circuit comprising:

a plurality of power supply pads including two or more kinds with different usage;

one or more switches having control terminals respectively, each of the switches connected to two of the power supply pads which are adjacent to each other so as to select a short-circuited state or an electrically isolated state between the two power supply pads;

the power supply pads comprises two or more kinds of high electric potential side power supply pads and low electric potential side power supply pads corresponding to the high electric potential side power supply pads, and the switches connected to the high voltage sides power supply pads are classified into one or more groups according to the kinds of the high voltage sides power supply pads connected to the switches, the switches belonging to each of the groups being connected to another one of the control lines in common, one or more control lines connected to the control terminals according to the kinds of the power supply pads to which the switches are connected; and a control unit is connected to the control lines to control the switches by supplying a control signal to each of the control lines, wherein the control unit comprises a fuse to produce first and second control signals and is configured so that a logical level of the first control signal is changed by blowing the fuse and so that a logical level of the second control signal is changed by a combination of an input signal provided from an outside and a blown or unblown state of the fuse.

* * * * *